United States Patent
Lee et al.

(10) Patent No.: US 10,158,068 B1
(45) Date of Patent: Dec. 18, 2018

(54) RESISTIVE RANDOM ACCESS MEMORY DEVICE AND METHOD FOR MANUFACTURING THE SAME

(71) Applicant: MACRONIX INTERNATIONAL CO., LTD., Hsinchu (TW)

(72) Inventors: Dai-Ying Lee, Hsinchu County (TW); Chao-I Wu, Hsinchu (TW); Yu-Hsuan Lin, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 11 days.

(21) Appl. No.: 15/623,461

(22) Filed: Jun. 15, 2017

(51) Int. Cl.
*H01L 45/00* (2006.01)

(52) U.S. Cl.
CPC ...... *H01L 45/1233* (2013.01); *H01L 45/1253* (2013.01); *H01L 45/146* (2013.01); *H01L 45/1616* (2013.01); *H01L 45/1675* (2013.01)

(58) Field of Classification Search
CPC .............. H01L 45/1233; H01L 45/1253; H01L 45/146; H01L 45/1616; H01L 45/1675
See application file for complete search history.

(56) References Cited

U.S. PATENT DOCUMENTS

| | | | |
|---|---|---|---|
| 9,431,603 B1* | 8/2016 | Hsieh | H01L 45/085 |
| 9,673,391 B2* | 6/2017 | Tu | H01L 45/146 |
| 2011/0280064 A1* | 11/2011 | Noshiro | G11C 11/5678 365/158 |
| 2013/0240824 A1* | 9/2013 | Oh | H01L 45/1233 257/4 |
| 2015/0117128 A1* | 4/2015 | Caubet | G11C 11/42 365/215 |
| 2017/0133434 A1* | 5/2017 | Ueki | H01L 27/2481 |
| 2018/0047786 A1* | 2/2018 | Konno | G11C 13/0002 |

* cited by examiner

*Primary Examiner* — Christine Enad
(74) *Attorney, Agent, or Firm* — McClure, Qualey & Rodack, LLP

(57) ABSTRACT

A ReRAM device is provided. The ReRAM device comprises a bottom electrode, a resistance switching layer disposed on the bottom electrode, a top electrode disposed on the resistance switching layer, a metal layer disposed on the top electrode, and a blocking layer covering the metal layer, wherein the blocking layer surrounds the metal layer and the top electrode.

18 Claims, 7 Drawing Sheets

US 10,158,068 B1

RESISTIVE RANDOM ACCESS MEMORY DEVICE AND METHOD FOR MANUFACTURING THE SAME

BACKGROUND

Field of the Invention

The disclosure relates in general to a resistive random access memory device and a method for manufacturing the resistive random access memory device.

Description of the Related Art

Resistive random-access memory (ReRAM) is a type of a memory having a component called a memristor (contraction of "memory resistor"), whose resistance varies when different voltages are imposed across it. The ReRAM device works by changing the resistance of the memristor to store data.

During manufacturing the ReRAM device, back-end processes, such as the processes for forming inter-metal dielectric (IMD) layers, metal layers, and passivation, may be performed, while it may cause data retention loss of the ReRAM device by the gas generated by these processes, such as H, $NH_3$, and $SiH_4$ . . . etc. Therefore, it is desirable to develop a method to prevent a ReRAM device from data retention loss and produce a ReRAM device with excellent structural reliability.

SUMMARY

The disclosure relates to a resistive random access memory (ReRAM) device and a method for manufacturing the same, which provide the ReRAM device with a blocking layer covering and surrounding the metal layer, so that the ReRAM device can have lower data retention loss after the back-end processes, such as the processes for forming inter-metal dielectric (IMD) layers, metal layers, and passivation, and the reliability of the ReRAM can be improved.

According to one embodiment, a ReRAM device is provided. The ReRAM device comprises a bottom electrode, a resistance switching layer disposed on the bottom electrode, a top electrode disposed on the resistance switching layer, a metal layer disposed on the top electrode, and a blocking layer covering the metal layer, wherein the blocking layer surrounds the metal layer and the top electrode.

According to one embodiment, a method for manufacturing the ReRAM device is provided. The method comprises forming an opening in an insulating layer; depositing a conductive material in the opening; removing the conductive material above the opening to form a bottom electrode; forming a resistance switching layer on the bottom electrode; forming a top electrode on the resistance switching layer; forming a metal layer on the top electrode; and forming a blocking layer covering the metal layer, wherein the blocking layer surrounds the metal layer and the top electrode.

The disclosure will become apparent from the following detailed description of the preferred but non-limiting embodiments. The following description is made with reference to the accompanying drawings.

DETAILED DESCRIPTION

Figure 1:
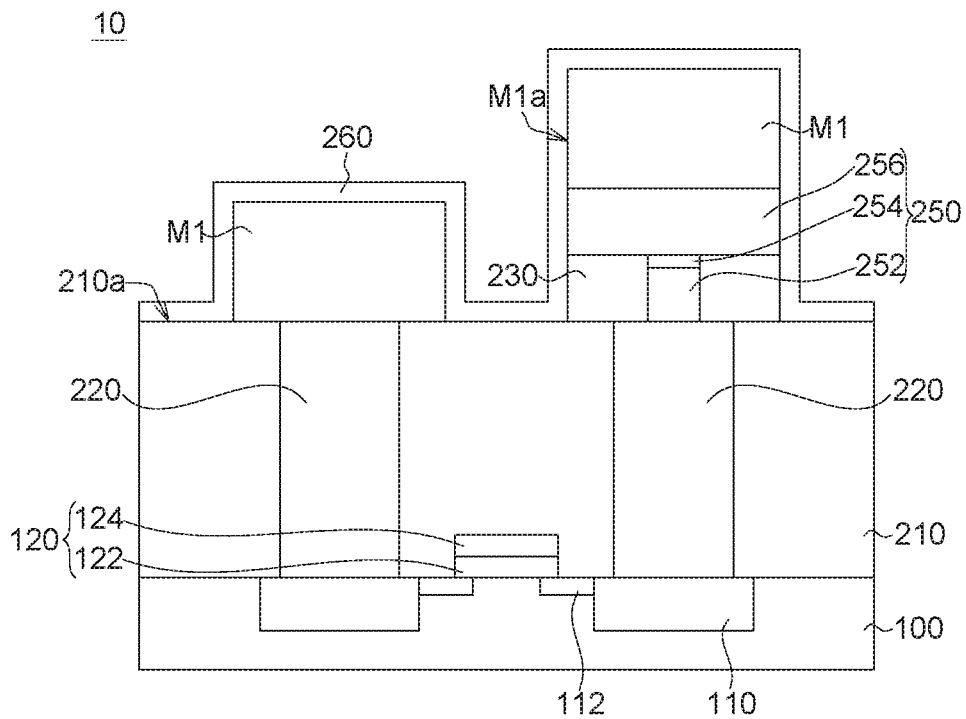
FIG. 1 is a cross-sectional view illustrating a ReRAM device according to one embodiment of the present application.

The embodiments of the present disclosure disclosed below are for elaborating a resistive random access memory (ReRAM) device and a method for manufacturing the same. The ReRAM device and the method for manufacturing the same provide the ReRAM device with a blocking layer covering and surrounding the metal layer to protect the ReRAM unit, so that the ReRAM device can have lower data retention loss after the back-end processes, such as the processes for forming inter-metal dielectric (IMO) layers, metal layers, and passivation, and the reliability of the ReRAM can be improved.

Several embodiments are provided hereinafter with reference to the accompanying drawings for describing the related procedures and configurations. Related structural details, such as layers and spatial arrangement, are further described in the embodiments. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

FIG. 1 is a cross-sectional view illustrating a ReRAM device according to one embodiment of the present application.

Referring to FIG. 1, a resistive random access memory (ReRAM) device 10 comprises a substrate 100, a dielectric layer 210 (such as an inter-layer dielectric (IUD)) disposed on the substrate 100, a conductive connecting structure 220 disposed on the substrate 100 and penetrating the dielectric layer 210, an insulating layer 230 disposed on the dielectric layer 210 and the conductive connecting structure 220, a bottom electrode 252 disposed over the substrate 100 and on the conductive connecting structure 220, a resistance switching layer 254 disposed on the bottom electrode 252, a top electrode 256 disposed on the resistance switching layer 254, a metal layer M1 disposed on the top electrode 256, and a blocking layer 260 covering the metal layer M1. A ReRAM unit 250 is formed by the bottom electrode 252, the resistance switching layer 254 and the top electrode 256.

In the present embodiment, the blocking layer 260 surrounds the insulating layer 230, the bottom electrode 252, the resistance switching layer 254, the top electrode 256, and the metal layer M1, and contacts a sidewall of the insulating layer 230, a sidewall of the top electrode 256, and a sidewall a of the metal layer M1. The dielectric layer 210 has a top surface 210a, and the blocking layer 260 continuously covers the top surface 210a, the insulating layer 230, the top electrode 256 and the metal layer M1. The bottom electrode 252 and the resistance switching layer 254 are disposed in an opening 240 (as shown in FIG. 2O) of the insulating layer 230.

In some embodiments, the substrate 100 may be formed of Si-containing oxide or other suitable material for the substrate. A well 110 and a lightly doped drain implant (LDD) may be formed in the substrate 100. The well 110 may be a P-type doped well or N-type doped well, and may be used as a source or a drain. A gate oxide structure 120 may be formed on the substrate 100. The gate oxide structure 120 may include an oxide layer 122 and a gate material layer 124. The gate material layer 124 may be formed of polysilicon. Spacers (not shown) may be formed on the sidewalls of the gate oxide structure 120. A field oxide layer (not shown) may be formed on the substrate 100.

In some embodiments, the dielectric layer 210 may have multiple layers, such as the multiple layers formed by an undoped silicate glass (USG), a phosphosilicate glass (PSG) layer, a silicon nitride (SiN) layer, and a tetraethoxysilane (TEOS) layer. The insulating layer 230 may be formed of a dielectric material, and have a thickness in a range of 200 angstrom to 2000 angstrom. In the present embodiment, the insulating layer 230 is formed of an oxide, and has a thickness of 1000 angstrom.

In some embodiments, the conductive connecting structure 220 may be a single layer structure or a bilayer structure. The conductive connecting structure 220 may be formed of metal, such as tungsten (W), TIN, or the combination thereof.

In some embodiments, the bottom electrode 252 may include, but not limited to, W, Cu, Fe, Ti, Ni, Hf, TiN, TaN, and other applicable materials. The bottom electrode 252 may be a single layer structure or a bilayer structure, such as a bilayer structure formed by W and TiN. The bottom electrode 252 may have a thickness in a range of 200 angstrom to 2000 angstrom. In the present embodiment, the bottom electrode 252 has a thickness of 1000 angstrom. In the present embodiment, the bottom electrode 252 is formed above a top surface 210a of the dielectric layer 210 and contacts the conductive connecting structure 220.

The resistance switching layer 254 may comprise a material selected from TiN, $WO_x$, $Ta_2O_5$, $HfO_2$, $SiO_2$. The material of the resistance switching layer 254 is not limited thereto, and can be any other material suitable to be a resistance switching layer in the ReRAM device. The bottom electrode 252 and the conductive connecting structure 220 may comprise a same material.

In some embodiments, the top electrode 256 may be a single layer structure or a multiple layer structure. For example, the top electrode 256 may be a bilayer structure formed of TiN and Ti.

In some embodiments, the material of the metal layer M1 may be any metal material, such as aluminum (Al), copper (Cu).

In some embodiments, the blocking layer 260 may include an oxynitride material, such as SiON, TiON or TiSiON, and has a thickness in a range of 50 angstrom to 1000 angstrom. In the present embodiment, the blocking layer 260 has a thickness of 500 angstrom.

In some embodiments, the ReRAM device 10 may comprise one or more dielectric layers (such as inter-metal dielectric (IMD) layers) disposed over the dielectric layer 210, and an passivation may be formed over the dielectric layer 210 and the inter-metal dielectric layers (not shown). An inter-metal dielectric layer may cover the blocking layer 260, and a via may be formed over the metal layer M1 and penetrate through a portion of the blocking layer 260 (not shown).

In some embodiments, the ReRAM unit 250 may be formed on the via which is disposed on the metal layer M1, not on the conductive connecting structure 220, and the blocking layer 260 may cover and contact another metal layer disposed over the via, not cover and contact the dielectric layer 210 (not shown). That is, the blocking layer 260 may surround the metal layer and the ReRAM unit above the via (not shown).

Since the blocking layer 260 continuously covers the top surface 210a of the dielectric layer 210 and the metal layer M1, and also surrounds the top electrode 256 and the metal layer M1, the ReRAM unit 250 can be well protected by the blocking layer 260, and can be avoided from being affected by the gas (such as H, NH3, or SiH4) generated by the following processes, such as the processes for forming inter-metal dielectric layers, metal layers, and passivation. Because the blocking layer 260 of the present disclosure is directly formed on the metal layer M1 and surrounds the top electrode 256 and the metal layer M1, the blocking layer 260 is not formed between the metal layer and the top electrode, it is not necessary to form another conductive structure between the metal layer and the top electrode, so that the manufacturing process of the present application is more simple and faster in comparison to a comparison example which has a blocking layer formed between the metal layer and the top electrode.

FIG. 2A to FIG. 2J are cross-sectional views illustrating a method for manufacturing a ReRAM device 10 according to one embodiment of the present disclosure.

Figure 2A:
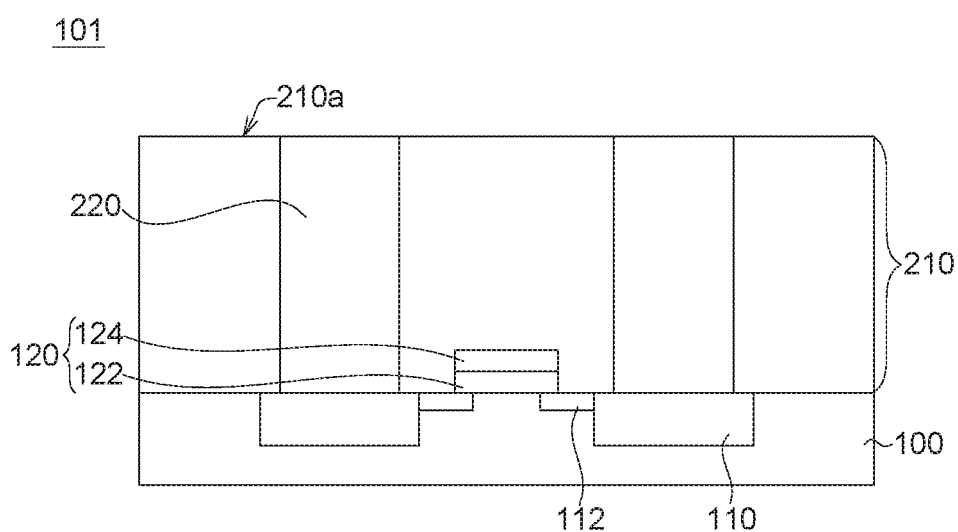
FIG. 2A to FIG. 2J are cross-sectional views illustrating a method for manufacturing a ReRAM device according to one embodiment of the present disclosure.

Referring to FIG. 2A, a preliminary structure 101 is provided. The preliminary structure 101 may be formed by a front-end process in a conventional CMOS process. The preliminary structure 101 may comprise a substrate 100, a well 110 formed in the substrate 100, a lightly doped drain implant (LDD) 112 formed in the substrate 100, a gate oxide structure 120 formed on the substrate 100, a dielectric layer (such as an inter-layer dielectric (ILD) layer) formed on the substrate 100, and a conductive connecting structure 220 formed on the substrate 100 and penetrating the dielectric layer 210. The gate oxide structure 120 may comprise an oxide layer 122 and a gate material layer 124. The gate material layer 124 may be formed of polysilicon. Spacers (not shown) may be formed on the side walls of the gate oxide structure 120. A field oxide layer (not shown) may be formed on the substrate 100. The conductive connecting structure 220 corresponds to the well 110 formed in the substrate 100. A Chemical Mechanical Polishing (CMP) process may be performed to expose a top surface 210a of the dielectric layer 210 and the conductive connecting structure 220.

Figure 2B:
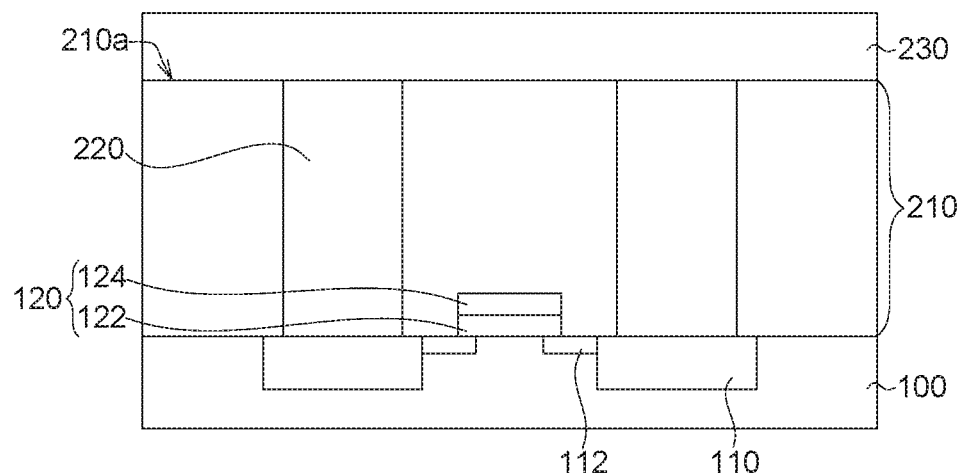

Referring to FIG. 2B, an insulating layer 230 is formed on the dielectric layer 210 and the conductive connecting structure 220 by a deposition process, such as Plasma-Enhanced Chemical Vapor Deposition (PECVD) or Chemical Vapor Deposition (CUD). The material of the insulating layer 230 may be formed of a dielectric material, and have a thickness in a range of 200 angstrom to 2000 angstrom. In the present embodiment, the insulating layer 230 is formed of an oxide, and has a thickness of 1000 angstrom.

Figure 2C:
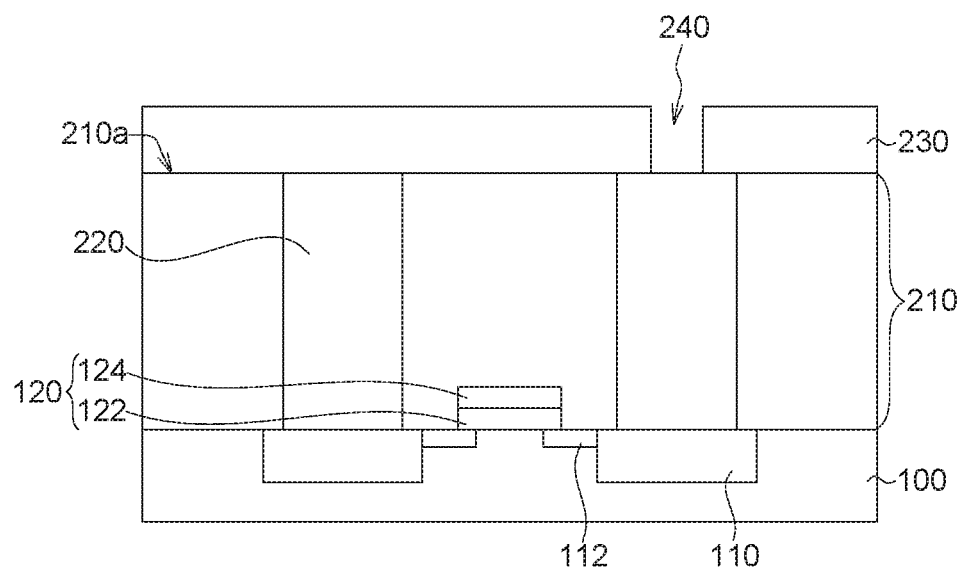

Referring to FIG. 2C, an opening 240 is formed in the insulating layer 230 by an etching process, such as a dry etching step. The opening 240 exposes a portion of the conductive connecting structure 220, and defines a region for forming the bottom electrode 252. A width of the opening 240 may be smaller than a width of the conductive connecting structure 220.

Figure 2D:
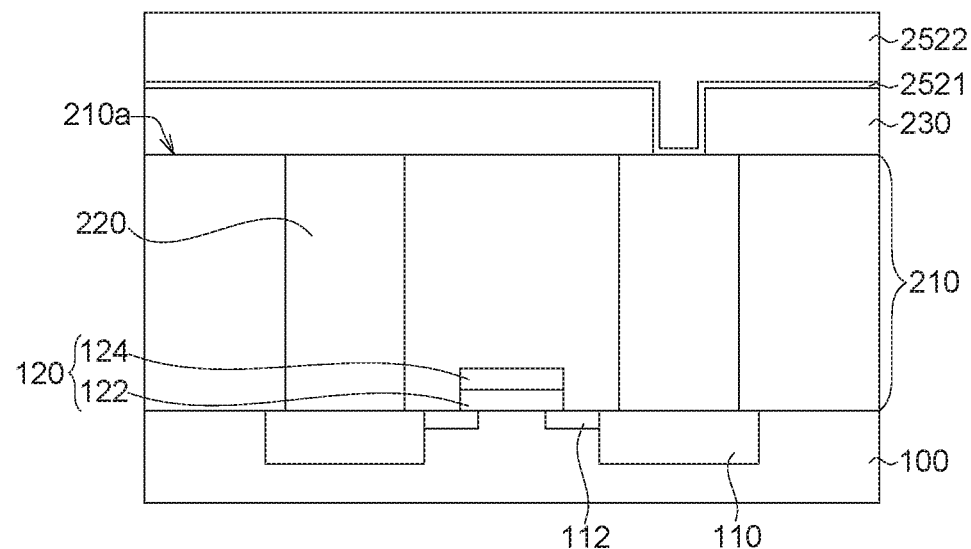

Referring to FIG. 2D, a first bottom electrode layer 2521 and a second bottom electrode layer 2522 are formed on the insulating layer 230 and in the opening 240. The first bottom electrode layer 2521 and the second bottom electrode layer 2522 may be formed by depositing a conductive material on the insulating layer 230 and in the opening 240. In one embodiment, the material of the first bottom electrode layer 2521 may be Ti or TiN, and the material of the second bottom electrode layer 2522 may include, but not limited to, W, Cu, Fe, Ti, Ni, Hf, TiN, TaN, and other applicable materials. The first bottom electrode layer 2521 may have a thickness in a range of 10 angstrom to 200 angstrom, and the second bottom electrode layer 2522 may have a thickness in a range of 1000 angstrom to 3000 angstrom. In the present embodiment, the first bottom electrode layer 2521 has a thickness of 25 angstrom, and the second bottom electrode layer 2522 has a thickness of 2500 angstrom.

Figure 2E:
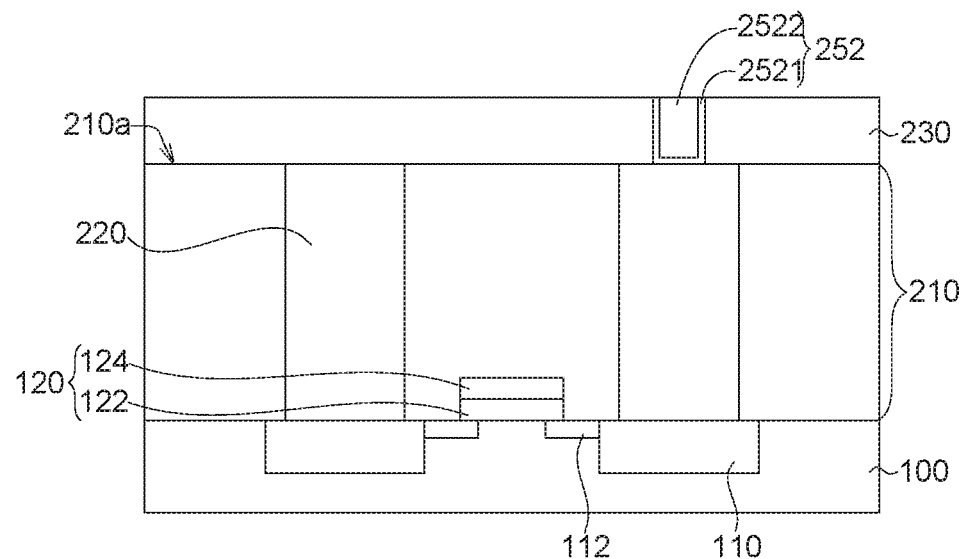

Referring to FIG. 2E, a portion of the first bottom electrode layer 2521 and the second bottom electrode layer 2522 are removed by a CMP step, and the conductive material above the opening 240 is removed. That is, the portion of the first bottom electrode layer 2521 and the second bottom electrode layer 2522 above the opening 240 are completely removed. Then, the bottom electrode 252 including the first bottom electrode layer 2521 and the second bottom electrode layer 2522 is formed in the opening 240 penetrating the insulating layer 230 and contacts the conductive connecting structure 220.

Figure 2F:
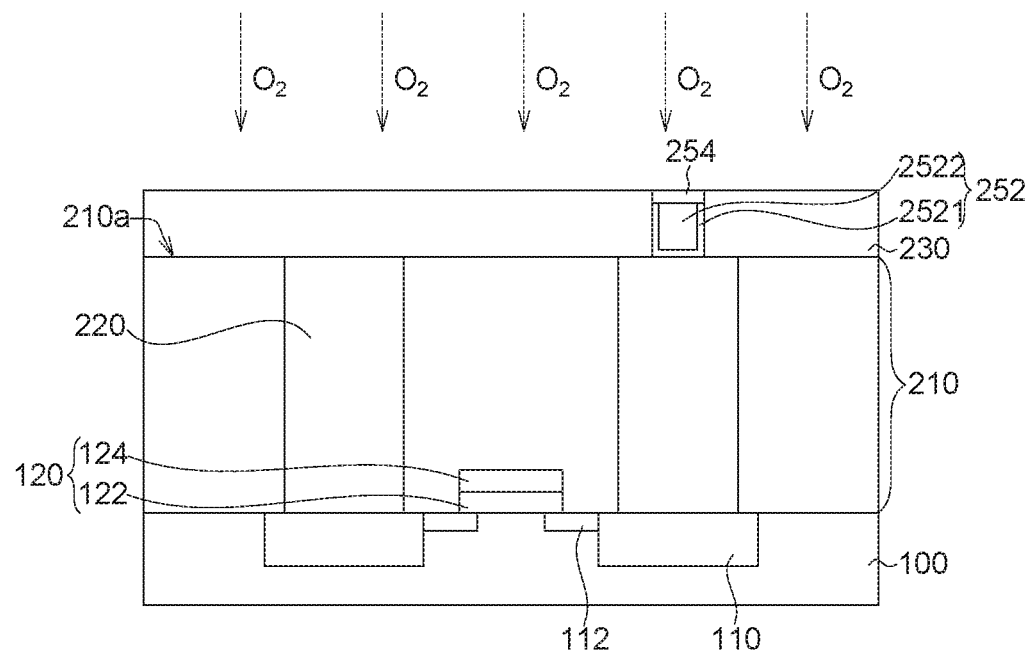

Referring to FIG. 2F, a resistance switching layer 254 then is formed by an oxidation process to the bottom electrode 252. In some embodiments, the oxidation process is implemented by a plasma oxidation process. The resistance switching layer 254 may comprise a material selected from TiN, $WO_X$, $Ta_2O_5$, $HfO_2$ . . . etc. In the present embodiment, the resistance switching layer 254 is formed of $WO_X$.

Figure 2G:
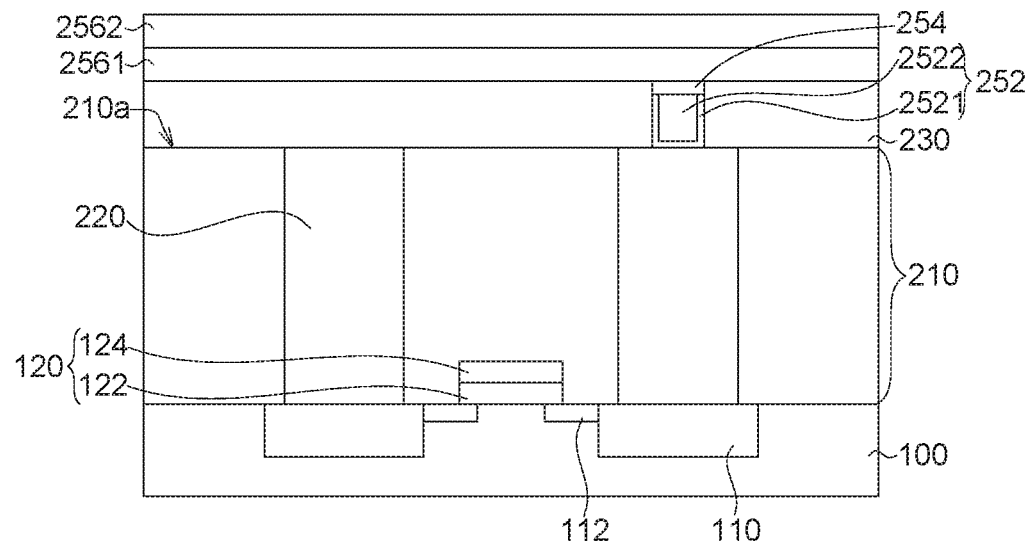

Referring to FIG. 2G, a first top electrode layer 2561 and a second top electrode layer 2562 are sequentially formed on the insulating layer 230 and the resistance switching layer 254 by a deposition process. The first top electrode layer 2561 may be formed of Ti, and have a thickness in a range of 10 angstrom to 100 angstrom. The second top electrode layer 2562 may be formed of TiN, and have a thickness in a range of 100 angstrom to 1000 angstrom.

Figure 2H:
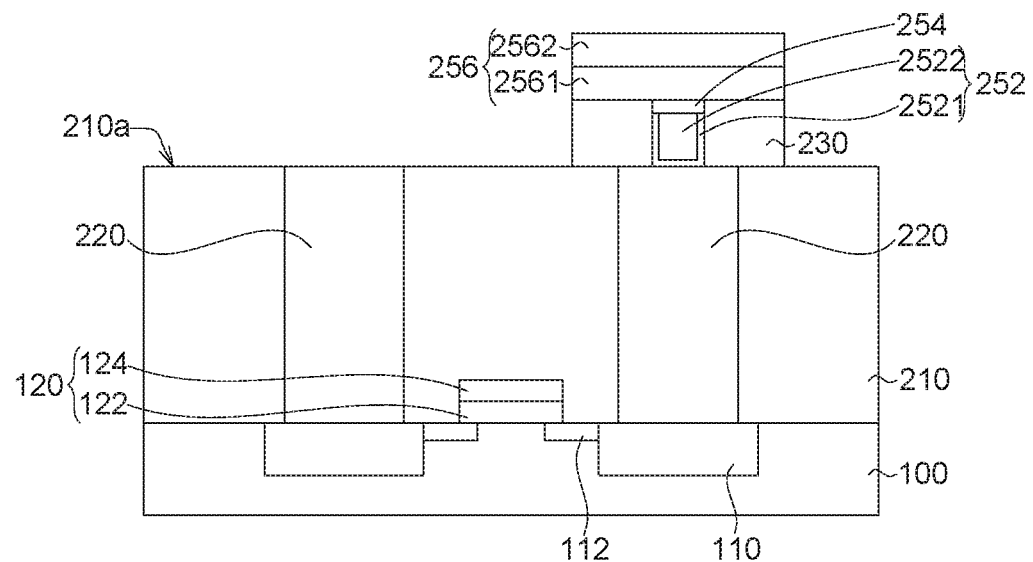

Referring to FIG. 2H, a portion of the insulating layer 230, the first top electrode layer 2561 and the second top electrode layer 2562 are removed by an etching process (such as a dry etching process), so that a top electrode 256 including the first top electrode layer 2561 and the second top electrode layer 2562 is formed. The first top electrode layer 2561 can be used as a buffer layer between the resistance switching layer 254 and the second top electrode layer 2562. After the etching process, the remaining portion of the insulating layer 230 may cover a portion of the top surface 210a of the dielectric layer 210 and the conductive connecting layer 220, and a sidewall of the insulating layer 230 may be aligned with a sidewall of the top electrode 256. In this way, the ReRAM unit 250 including the bottom electrode 252, the resistance switching layer 254 and the top electrode 256 is formed on the conductive connecting structure 220. The top electrode 256 is exemplified as a bilayer structure, but the structure of the top electrode 256 is not limited thereto.

Figure 2I:
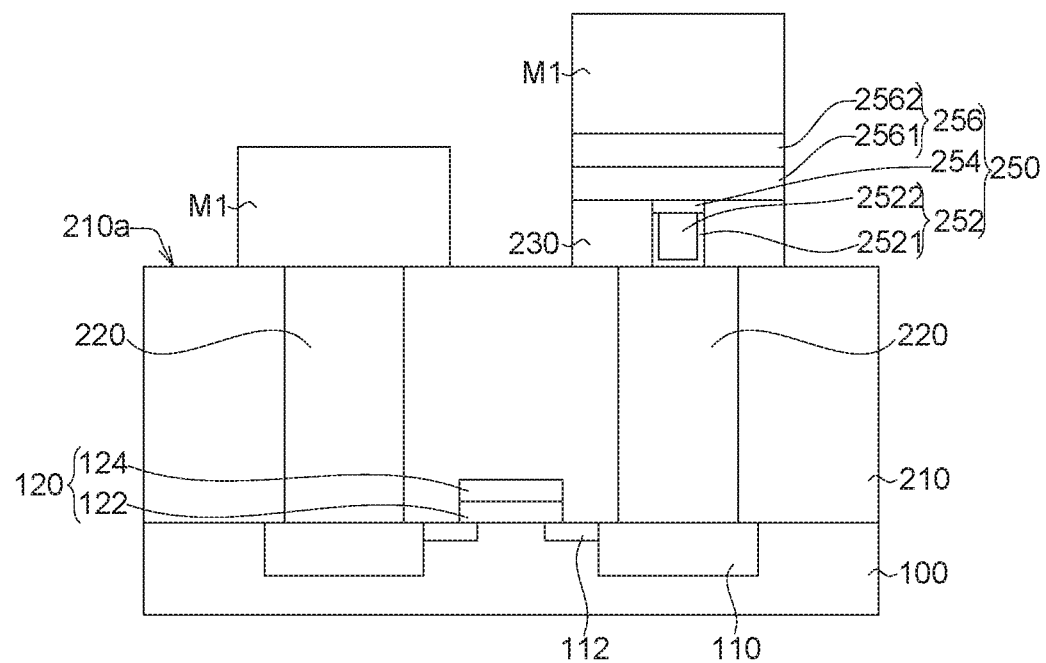

Referring to FIG. 2I, a metal layer M1 is formed over the conductive connecting structure 220 and the top electrode 256. Then, the metal layer M1 corresponding to the conductive connecting layer 220 is formed by an etching process. A sidewall M1a of the metal layer M1 is aligned with the sidewall of the top electrode 256 and the sidewall of the insulating layer 230. The metal layer M1 may be any metal material, such as aluminum (Al), copper (Cu).

Figure 2J:
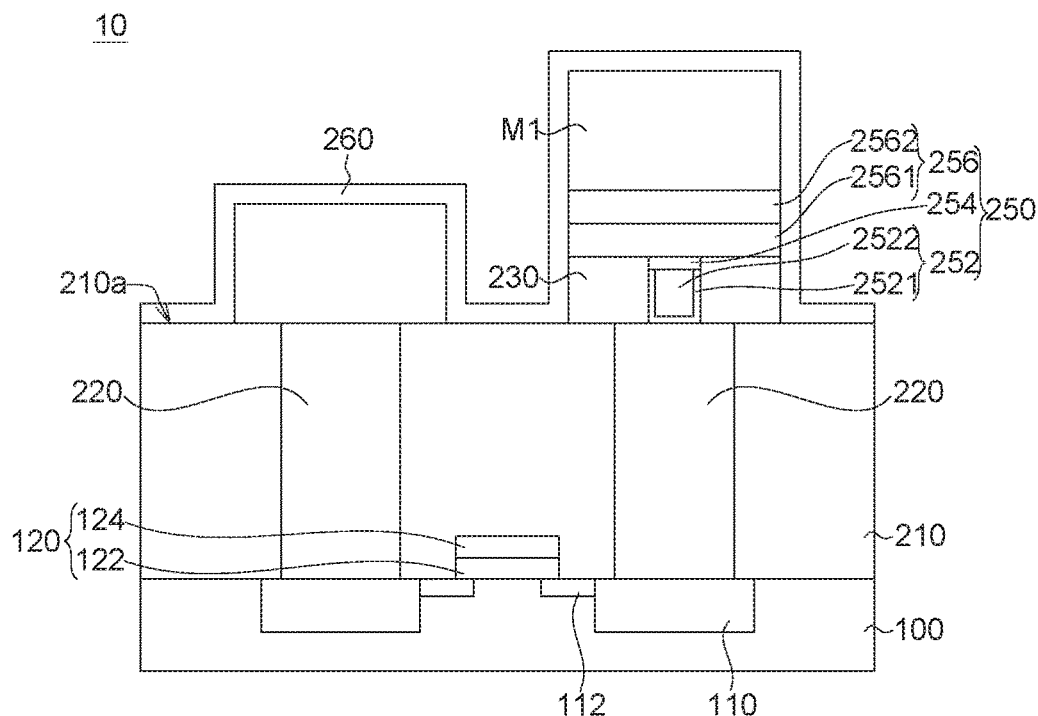

Referring to FIG. 2J, a blocking layer 260 is formed covering the top surface 210a of the dielectric layer 210, the insulating layer 230, the ReRAM unit 250 and the metal layer M1 by a deposition process. In some embodiments, the blocking layer 260 may include an oxynitride material, such as SiON, TON or TiSiON, and has a thickness in a range of 50 angstrom to 1000 angstrom. In the present embodiment, the blocking layer 260 is formed of SiON and has a thickness of 500 angstrom. In this way, the ReRAM device 10 according to one embodiment of the present application is formed.

Figure 3:
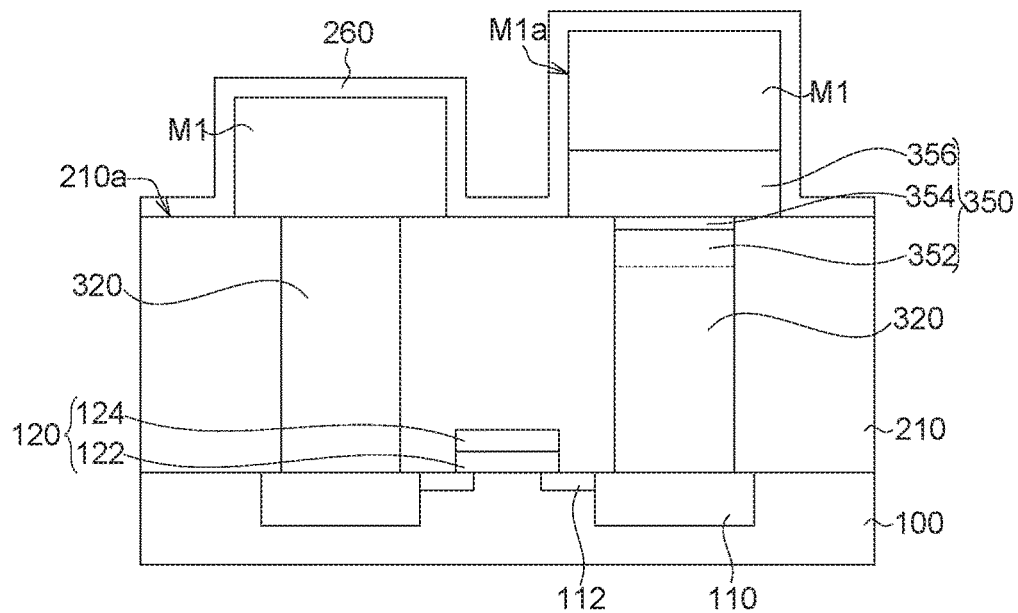
FIG. 3 is a cross-sectional view illustrating a ReRAM device according to another embodiment of the present application.

FIG. 3 is a cross-sectional view illustrating a ReRAM device 20 according to another embodiment of the present application. Please also refer to FIG. 1. Also, the identical and/or similar elements in the structures of FIG. 3 and FIG. 1 are designated with the same and/or similar reference numerals, and the details of the configurations, procedures and working principles of the identical components/layers are not redundantly described.

Referring to FIG. 3, a bottom electrode 352 and a conductive connecting structure 320 may have a same material and a same width formed by different deposition processes. Or, the bottom electrode 352 and the conductive connecting structure 320 may be substantially the same structure formed by the same processes. The bottom electrode 352 may be formed in an opening of the dielectric layer 210, and the resistance switching layer 324 may be formed by an oxidation process to the bottom electrode 352. The bottom electrode 352 and the resistance switching layer 354 may be formed below the top surface 210a. A top electrode 356 may be formed on a portion of the top surface 210a and the resistance switching layer 354. In this way a ReRAM unit 350 including the bottom electrode 352, the resistance switching layer 354 and the top electrode 356 is formed on the conductive connecting structure 320. The metal layer M1 is disposed on the top electrode 356. The blocking layer 260 continuously covers the top surface 210a and the metal layer M1 and surrounds the metal layer M1 and the top electrode 356. The blocking layer 260 also contacts a sidewall of the top electrode 356 and the sidewall M1a of the metal layer M1.

Figure 4:
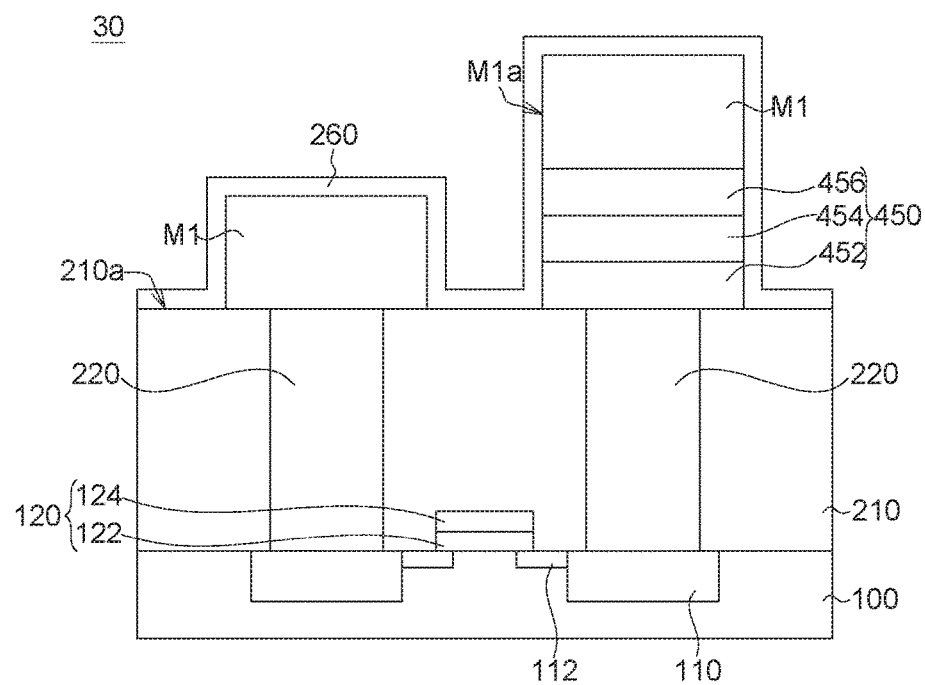
FIG. 4 is a cross-sectional view illustrating a ReRAM device according to a further embodiment of the present application.

FIG. 4 is a cross-sectional view illustrating a ReRAM device 30 according to further embodiment of the present application. Please also refer to FIG. 1. Also, the identical and/or similar elements in the structures of FIG. 4 and FIG. 1 are designated with the same and/or similar reference numerals, and the details of the configurations, procedures and working principles of the identical components/layers are not redundantly described.

Referring to FIG. 4, a bottom electrode 452 is not formed in an opening of an insulating layer on the dielectric layer, but directly formed on the top surface 210a and the conductive connecting structure 220. The insulating layer may not be remained on the top surface 210a of the dielectric layer 210, and the bottom electrode 452 covers and contacts a portion of the top surface 210a and the conductive connecting structure 220. A width of the bottom electrode 452 is larger than a width of the conductive connecting structure 220. A resistance switching layer 454 is disposed on the bottom electrode 452, and a top electrode 456 is disposed on the resistance switching layer 454. In this way, a ReRAM unit 450 including the bottom electrode 452, the resistance switching layer 454 and the top electrode 456 is formed on the conductive connecting structure 220. The metal layer M1 is disposed on the top electrode 456. The blocking layer 260 continuously covers the top surface 210a and the metal layer M1, and surrounds the metal layer M1 and the ReRAM unit 450. Also, the blocking layer 260 contacts a sidewall of the bottom electrode 452, a sidewall of the resistance switching layer 454, a sidewall of the top electrode 456, and the sidewall M1a of the metal layer M1.

According to the aforementioned description, the blocking layer covers the metal layer, and surrounds the top electrode and the metal layer, so that the ReRAM unit can be well protected by the blocking layer, and can be avoided from being affected by the gas (such as H, NH3, or SiH4) generated by the following processes, such as the processes for forming inter-metal dielectric layers, metal layers, and passivation. By forming the blocking layer after forming the metal layer, the blocking layer can be directly formed on the metal layer. That is, the electrical connection between the metal layer and the top electrode may not be interrupted by the blocking layer, and it is not necessary to form another conductive structure between the metal layer and the top electrode, so that the manufacturing process of the present application is more simple and faster in comparison to a comparison example which has a blocking layer formed between the metal layer and the top electrode. Therefore, the ReRAM device of the present disclosure can have less data retention loss and a better ReRAM reliability, and the manufacturing method of the ReRAM device may have less consumption in the cost and the time.

Other embodiments with different configurations of known elements in the device can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A resistive random access memory (ReRAM) device, comprising:
    a bottom electrode;
    a resistance switching layer disposed on the bottom electrode;
    a top electrode disposed on the resistance switching layer;
    a metal layer disposed on the top electrode;
    a blocking layer covering the metal layer, wherein the blocking layer surrounds and contacts the metal layer and the top electrode;
    a substrate, wherein the bottom electrode is disposed over the substrate;
    a dielectric layer disposed on the substrate; and
    a conductive connecting structure disposed on the substrate and penetrating the dielectric layer, wherein the dielectric layer has a top surface, and the blocking layer continuously and directly covers and contacts the top surface and the metal layer.

2. The ReRAM device according to claim 1, wherein the blocking layer comprises an oxynitride material.

3. The ReRAM device according to claim 2, wherein the oxynitride material is SiON, TiON or TiSiON.

4. The ReRAM device according to claim 1, wherein the blocking layer has a thickness in a range of 50 angstrom to 1000 angstrom.

5. The ReRAM device according to claim 1, wherein the bottom electrode and the conductive connecting structure are in contact and comprise a same material.

6. The ReRAM device according to claim 1, wherein the resistance switching layer and the bottom electrode are formed above the top surface of the dielectric layer, and the blocking layer further surrounds the resistance switching layer and the bottom electrode.

7. The ReRAM device according to claim 1, further comprising an insulating layer disposed on the dielectric layer and the conductive connecting structure, wherein the bottom electrode and the resistance switching layer are disposed in an opening of the insulating layer, and the blocking layer further surrounds the insulating layer.

8. The ReRAM device according to claim 1, wherein the blocking layer contacts a sidewall of the metal layer.

9. The ReRAM device according to claim 1, wherein the top electrode is a bilayer structure.

10. A method for manufacturing a resistive random access memory (ReRAM) device, comprising:
    forming an opening in an insulating layer;
    depositing a conductive material in the opening;
    removing the conductive material above the opening to form a bottom electrode;
    forming a resistance switching layer on the bottom electrode;
    forming a top electrode on the resistance switching layer;
    forming a metal layer on the top electrode;
    forming a blocking layer covering the metal layer, wherein the blocking layer surrounds and contacts the metal layer and the top electrode;
    forming a substrate before forming the bottom electrode, wherein the bottom electrode is formed over the substrate;
    forming a dielectric layer on the substrate; and
    forming a conductive connecting structure on the substrate and the conductive connecting, structure penetrating the dielectric layer, wherein the dielectric layer has a top surface, and the blocking layer continuously and directly covers and contacts the top surface and the metal layer.

11. The method according to claim 10, wherein the blocking layer comprises an oxynitride material.

12. The method according to claim 11, wherein the oxynitride material is SiON, TiON or TiSiON.

13. The method according to claim 10, wherein the blocking layer has a thickness in a range of 50 angstrom to 1000 angstrom.

14. The method according to claim 10, wherein the bottom electrode and the conductive connecting structure are in contact and comprise a same material.

15. The method according to claim 10, wherein the resistance switching layer and the bottom electrode are formed above the top surface of the dielectric layer, and the blocking layer further surrounds the resistance switching layer and the bottom electrode.

16. The method according to claim 10, further comprising:
- forming the insulating layer on the dielectric layer and the conductive connecting structure, wherein the bottom electrode and the resistance switching layer are formed in the opening of the insulating layer, and the blocking layer further surrounds the insulating layer.

17. The method according to claim 10, wherein the blocking layer contacts a sidewall of the metal layer.

18. The method according to claim 10, wherein the top electrode is a bilayer structure.

\* \* \* \* \*